United States Patent [19]

Requardt

[11] Patent Number: 4,825,164
[45] Date of Patent: Apr. 25, 1989

[54] SURFACE RESONATOR FOR NUCLEAR MAGNETIC RESONANCE EQUIPMENT

[75] Inventor: Hermann Requardt, Erlangen, Fed. Rep. of Germany

[73] Assignee: Siemens Aktiengesellschaft, Berlin and Munich, Fed. Rep. of Germany

[21] Appl. No.: 156,587

[22] Filed: Feb. 17, 1987

[30] Foreign Application Priority Data

Feb. 25, 1987 [DE] Fed. Rep. of Germany ....... 3706087

[51] Int. Cl.$^4$ ............................................. G01R 33/20
[52] U.S. Cl. ..................................... 324/322; 324/318
[58] Field of Search ............... 324/318, 322, 311, 316; 343/741, 742, 744, 748, 788, 867

[56] References Cited

U.S. PATENT DOCUMENTS

| | | | |
|---|---|---|---|
| 2,280,562 | 4/1942 | Weagant | 343/748 |
| 4,398,149 | 8/1983 | Zens | 324/316 |
| 4,613,837 | 9/1986 | Blass et al. | 324/318 |
| 4,636,730 | 1/1987 | Bottomley | 324/318 |
| 4,691,163 | 9/1987 | Blass et al. | 324/318 |
| 4,703,274 | 10/1987 | Kaufman et al. | 324/318 |
| 4,707,664 | 11/1987 | Fehn et al. | 324/318 |
| 4,714,887 | 12/1987 | Meissner et al. | 324/322 |
| 4,721,913 | 1/1988 | Hyde et al. | 324/318 |
| 4,739,269 | 4/1988 | Kopp | 324/322 |

FOREIGN PATENT DOCUMENTS 0191180 8/1986 European Pat. Off. .
0201084 11/1986 European Pat. Off. .

OTHER PUBLICATIONS

"Counter Rotating Current Local Coils for High-Resolution Magnetic Resonance Imaging," Froncisz et al., Mag. Res. in Med. vol. 3, (1986) pp. 590-603.

*Primary Examiner*—Stewart J. Levy
*Assistant Examiner*—Kevin D. O'Shea
*Attorney, Agent, or Firm*—Hill, Van Santen, Steadman & Simpson

[57] ABSTRACT

A surface resonator suitable for use in nuclear magnetic resonance equipment has two adjacently disposed windings, the respective ends of each winding being connected to each other through a series circuit including two capacitors. The respective junctions of the capacitors with each other constitute the electrical symmetry point for each winding, and are connected to ground. The signal tap for the surface resonator is galvanically taken at the ends of each winding. The surface resonator can be used for imaging and spectroscopy using nuclear magnetic resonance principles.

9 Claims, 2 Drawing Sheets

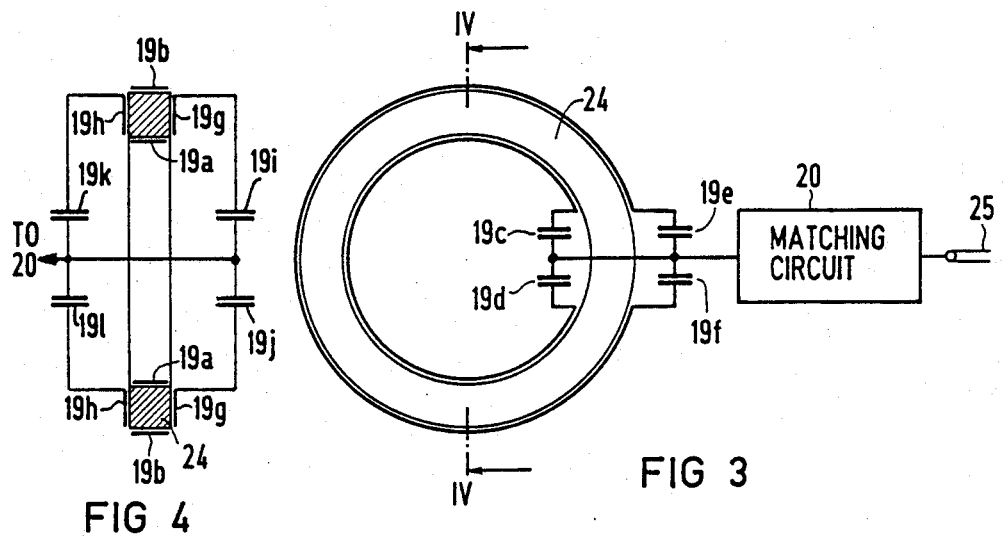
FIG 4
FIG 3
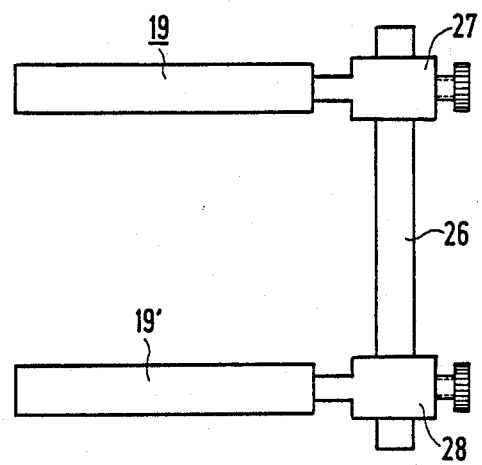
FIG 5

SURFACE RESONATOR FOR NUCLEAR MAGNETIC RESONANCE EQUIPMENT

BACKGROUND OF THE INVENTION

1. Field of the Invention

The present invention is directed to a surface resonator having two adjacently disposed windings of the type used in conducting examinations with nuclear magnetic resonance equipment.

1. Description of the Prior Art

A surface coil of the type suitable for use in nuclear magnetic resonance equipment having two adjacently disposed windings is described in the article "Counter-Rotating Current Local Coils for High Resolution Magnetic Resonance Imaging," in Magnetic Resonance in Medicine, Vol. 3, 1986 at pages 590–603. Two loop-gap resonators are disclosed therein which are disposed adjacent to each other, and electrically coupled to each other. Two resonance conditions having different resonant frequencies are possible, whereby the currents in the loop-gap resonators flow in the same direction in one case, and in opposite directions in the other case. Coupling of this surface resonator to the nuclear magnetic resonance equipment is undertaken with a coupling coil arranged in the inside of the surface resonator.

Surface resonators are used in the same manner as surface coils when signals from a locally limited examination region are to be acquired with increased resolution. Such surface resonators can also be used as a transmitter as well as a receiver for imaging and spectroscopy. In all applications, however, the coupling coil disposed inside the surface resonator prevents complete symmetry from being achieved, so that the respective transmission and reception fields lose homogeneity. Transformation losses are also associated with the inductive coupling. When such a resonator is used for imaging, image disturbances occur as a result of the presence of the coupling coil.

SUMMARY OF THE INVENTION

It is an object of the present invention to provide a surface resonator having two adjacently disposed windings which exhibits electrical symmetry, and which therefore generates and receives homogeneous fields.

The above object is achieved in accordance with the principles of the present invention in a surface resonator having two adjacent windings, each winding having two free ends which are connected to each other via a series circuit consisting of two capacitors. The junction point between the capacitors is located at the electrical symmetry point for the associated winding, which as used herein means the electrical characteristics (capacitance, impedance) on both sides of the electrical symmetry point are equal. Signal input and signal output for each winding is also undertaken at this point, which is connected to a matching circuit for this purpose.

Each winding may simply consist of a ribbon or band of copper foil.

In one embodiment, the windings in the form of copper foil ribbons may be mounted on a carrier in the form of a bar having a rectangular cross section, the bar being shaped into a ring. The two windings are disposed on opposite sides of the ring. In a further variation of this embodiment, another set of windings, with associated capacitors as described above, can be disposed on the other two opposite sides of the ring. The values of the capacitors for this second set of windings may be selected different from the values for the first set of windings, so that a separate resonator operable at a different frequency is formed.

The surface resonator described herein can be used at different resonant frequencies for examining different nuclei by alternatively using one or the other sets of windings.

A uniform sensitivity field for the surface resonator described herein is obtained in a further embodiment wherein two surface resonators, as described above, are disposed in a Helmholtz arrangement, with all of the axes for the respective windings disposed on a line.

DESCRIPTION OF THE DRAWINGS

FIG. 3 shows the mechanical arrangement of a surface resonator constructed in accordance with the principles of the present invention.

FIG. 4 is a sectional view taken along line IV—IV of FIG. 3 showing a further embodiment of a surface resonator constructed in accordance with the principles the present invention.

FIG. 5 is a side view of two surface resonators constructed in accordance with the principles of the present invention in a Helmholtz arrangement.

DESCRIPTION OF THE PREFERRED EMBODIMENTS

Figure 1:
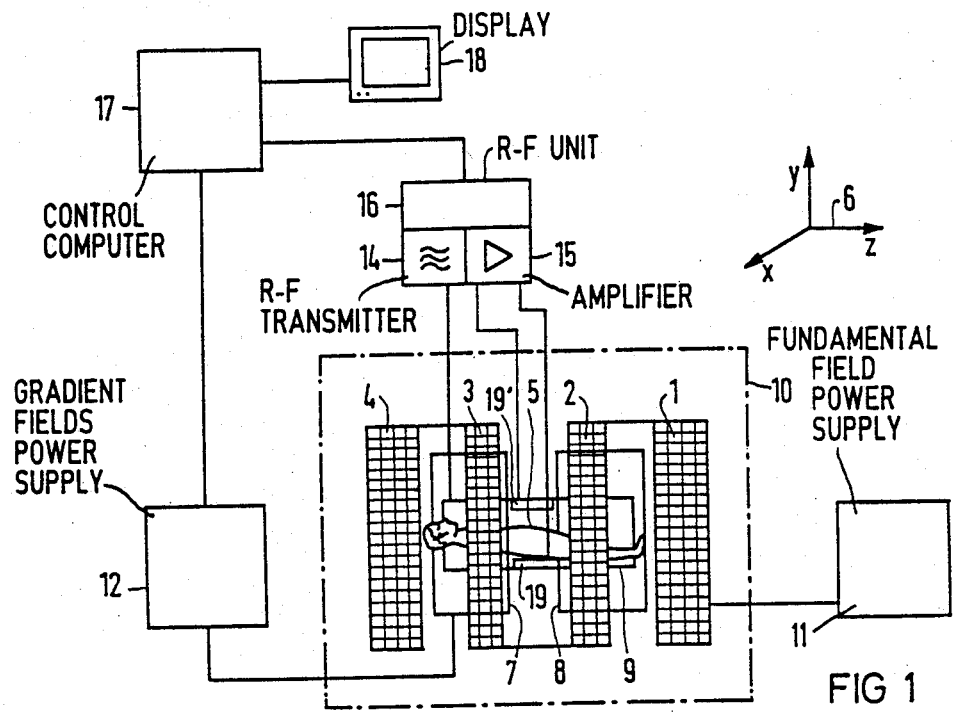
FIG. 1 is a schematic block diagram of a nuclear magnetic resonance apparatus of the type in which the surface resonator disclosed herein may be used.

The basic components of a nuclear magnetic resonance device for identifying the spectra or generating an image of an examination subject are shown in FIG. 1. The apparatus includes coils 1, 2, 3 and 4 which generate a fundamental magnetic field in which a patient 5 to be examined is disposed. A plurality of sets of gradient coils are also provided, which generate independent orthogonal magnetic field gradients in the x, y and z directions of a coordinate system generally referenced at 6. For clarity, only gradient coils 7 and 8 are shown in the drawing. The coils 7 and 8, in combination with a pair of identical gradient coils disposed on the opposite side of the patient 5, generate a gradient field in the x-direction. Identical gradient coils (not shown) for generating a gradient field in the y-direction are disposed above and below the patient 5, parallel thereto. Coils for generating a gradient field in the z-direction (not shown) are disposed transversely relative to the longitudinal axis of the patient 5, at the feet and head of the patient 5.

The apparatus also includes an antenna in the form of a body resonator 9 for generating nuclear magnetic resonance signals in the patient 5. Surface resonators 19 and 19' are provided above and below the patient 5 for receiving the nuclear magnetic resonances signals.

The coils 1, 2, 3, 4, 7, 8 and 9, surrounded by the dot-dash line 10, constitute the actual examination instrument in which the patient 5 is disposed. This instrument is operated from an electrical arrangement which includes a power supply 11 for the fundamental field coils 1 through 4, and a gradient power supply 12 for the gradient coils 7 and 8, as well as the other gradient coils which are not shown in the drawing.

A radio frequency transmitter 14, controlled by a process computer 17, is connected to the whole-body resonator 9. The surface resonators 19 and 19' are also coupled to the computer 17 via a signal amplifier 15. The transmitter 14 and the signal amplifier 15 are components of a conventional radio frequency unit 16 for signal generation and reception.

The process computer 17, in a known manner, constructs a graphical representation of a spectrum, or an image, of the region of interest of the patient 5 from the incoming signals, and this image is visually represented on a display 18.

Figure 2:
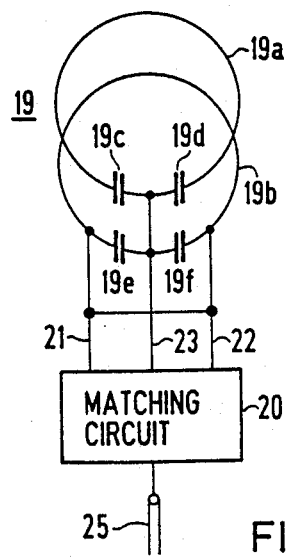
FIG. 2 is an electrical circuit diagram of a surface resonator constructed in accordance with the principles of the present invention.

Details of the surface resonator 19 (to which the surface resonator 19' is identical) constructed in accordance with the principles of the present invention are shown in FIG. 2. The surface resonator 19 includes two windings 19a and 19b disposed adjacent to each other. The ends of each winding 19a and 19b are connected to each other by a series circuit consisting of two capacitors. The ends of winding 19a are connected via capacitors 19c and 19d, and the ends of winding 19b are connected by capacitors 19e and 19f. The center taps or junctions between the capacitors 19c and 19d, and between the capacitors 19e and 19f, represent the electrical symmetry point for the winding respectively connected thereto. Those points are connected to a grounded potential in a matching circuit 20. Signal input and output for the matching circuit 20 is undertaken via a coaxial line 25.

Signal feed to the surface resonator is undertaken from the matching circuit 20 via shielded lines 21 and 22 which are connected to those ends of the winding 19b respectively connected to the capacitors 19e and 19f. The matching circuit 20 is thus directly galvanically coupled to the winding 19b, with coupling to the winding 19a ensuing inductively. The structure shown in FIG. 2 is electrically capable of resonance, with the resonant frequency determined by the windings 19a and 19b as well as by the capacitances of the capacitors 19c, 19d, 19e and 19f.

Good electrical symmetry is achieved by this type of coupling, and thus the transmission field and the reception field are homogeneous. Transmission losses are avoided by the galvanic coupling. Moreover, because the structure disclosed herein does not require the use of coupling coils as in known surface resonators, there are no image disturbances resulting from the presence of such coupling coils, as result from such conventional devices.

A convenient structure for mounting the windings 19a and 19b is shown in FIG. 3, wherein the windings are disposed on opposite sides of a ring 24 having a rectangular cross section. As can be seen in FIG. 4, this arrangement permits a further set of windings 19g and 19h (not shown in FIG. 3) to be mounted on the remaining opposite sides of the ring 24. The free ends of the winding 19g are connected to the matching circuit 20 via capacitors 19i and 19j, and the free ends of the winding 19h are connected to the matching circuit 20 via capacitors 19k and 19l, as described above for the windings 19a and 19b. The windings 19g and 19h are thus connected to grounded potential, and one of those windings has a direct galvanic connection to the signal terminal of the matching circuit 20, as also described above for windings 19a and 19b.

The windings 19g and 19h form a second resonator which, by different dimensioning of the associated capacitors, can be set to a resonant frequency different from the resonant frequency of the resonator formed by the windings 19a and 19b. Investigation of nuclei having different resonant frequencies is thus possible in the embodiment of FIG. 4. The windings 19a, 19b, 19g and 19h may each consist of copper foil glued or otherwise attached to the ring 24.

An embodiment wherein two surface resonators 19 and 19', each constructed in accordance with the principles of the present invention, in a Helmholtz arrangement is shown in FIG. 5. The surface resonators 19 and 19' are displaceably mounted on a stand 26 by releasable clamps 27 and 28.

A homogeneous field in which the examination subject can be disposed is generated between the two surface resonators 19 and 19'.

The Helmholtz arrangement of two resonators 19 and 19' shown in FIG. 5 has a number of advantages in comparison to a Helmholtz arrangement consisting simply of surface coils. The LC relationship of the surface resonator disclosed herein is more favorable than that for surface coils, because the indictance L becomes smaller as a result of the capacitance C of the capacitors 19c, 19d, 19e and 19f. A higher resonant circuit quality and a better signal-to-noise ration are obtained as a result of the more favorable LC ratio. The arrangement of the copper foils permits the field distribution to be better controlled than for a surface coil consisting of wire. As a result of the aforementioned symmetry obtained with the surface resonator as described above, substantially no "envelope" waves occur, i.e., currents arising on the reference conductor 23 of FIG. 2 due to asymmetry.

As in the case of the loop-gap resonators described in the aforementioned Magnetic Resonance In Medicine article, two resonant conditions having different resonant frequencies would also be possible in the surface resonator disclosed herein if the two windings 19a and 19b (or 19g and 19h) were not connected to each other. In a first resonant condition wherein the magnetic field lines uniformly extend through both windings, the currents flow in the same direction in both windings. In a second resonant condition wherein the magnetic field lines close around a winding, the currents in the two windings flow in opposite directions. If the two windings 19a and 19b (or 19g and 19h) are cross-connected to each other, the first resonant condition is suppressed, so that homogeneous magnetic fields which uniformly extend through both windings do not lead to a resulting induction. Such a surface resonator thus no longer reacts to excitation fields which, for example, derive from a body resonator, but only react to signals from the examination subject, whose field is always non-uniform. A decoupling of the surface resonator from the body resonator is thus achieved.

Although modifications and changes may be suggested by those skilled in the art it is the intention of the inventor to embody within the patent warranted hereon all changes and modifications as reasonably and properly come within the scope of his contribution to the art.

I claim as my invention:

1. A surface resonator arrangement for use in nuclear magnetic resonance examination apparatus having means for supplying signals to and receiving signals from said surface resonator arrangement, said surface resonator arrangement including a surface resonator comprising:

first and second windings each having free ends;

a first pair of series-connected capacitors connected across the free ends of said first winding, said first pair of capacitors having a junction therebetween disposed at an electrical symmetry point for said first winding;

a second pair of series-connected capacitors connected across the free ends of said second winding, said second pair of capacitors having a junction therebetween disposed at an electrical symmetry point of said second winding;

each of said first and second windings connected to ground at said junctions; and means directly electrically connecting one of said windings to said means for supplying and receiving signals.

2. A surface resonator arrangement as claimed in claim 1, wherein said first and second windings each consist of a ribbon of electrically conductive foil.

3. A surface resonator arrangement as claimed in claim 2, wherein said foil consists of copper.

4. A surface resonator arrangement as claimed in claim 1, further comprising a carrier for said first and second windings consisting of a circular bar having a rectangular cross section with pairs of opposite surfaces, said first and second windings being respectively attached to opposite surfaces of one of said pairs.

5. A surface resonator arrangement as claimed in claim 4, further comprising:

third and fourth windings each having free ends;

a third pair of series-connected capacitors electrically connected across the free ends of said third winding, said third pair of capacitors having a junction therebetween disposed at an electrical symmetry point for said third winding;

a fourth pair of series-connected capacitors electrically connected across the free ends of said fourth winding, said fourth pair of capacitors having a junction therebetween disposed at an electrical symmetry point of said fourth winding;

said third and fourth windings being connected to ground at said junctions; and means for directly electrically connecting one of said third or fourth windings to said means for supplying and receiving signals, said third and fourth windings and said third and fourth pairs of capacitors forming a further surface resonator, said third and fourth pairs of capacitors having in combination a capacitance different from the capacitance of said first and second pairs of capacitors in combination so that said further surface resonator has a different resonant frequency from said surface resonator.

6. A surface resonator arrangement as claimed in claim 1, further comprising an additional surface resonator constructed identically to said surface resonator, each of said surface resonator and said additional surface resonator having a winding axis, and means for mounting said surface resonator and said additional surface resonator in a Helmholtz arrangement with the winding axes of said surface resonator and said additional surface resonator in a line.

7. A surface resonator arrangement for use in a nuclear magnetic resonance examination apparatus having means for supplying signals to and receiving signals from said surface resonator arrangement, said surface resonator arrangement comprising:

a circular carrier having a rectangular cross section, said carrier having first and second pairs of opposite surfaces;

a first surface resonator having first and second windings respectively disposed on said first pair of opposite surfaces of said carrier, each of said windings having free ends and said first surface resonator further having first and second capacitor means for respectively connecting said free ends of said windings, each of said first and second capacitor means having an electrical symmetry point for the winding connected thereto, each of said symmetry points being connected to ground;

a second surface resonator having windings respectively disposed on said second pair of opposite surfaces of said carrier, said windings each having free ends and said second surface resonator further having third and fourth capacitor means for respectively connecting the free ends of each of said windings in said second surface resonator, each of said third and fourth capacitor means having an electrical symmetry point for the winding connected thereto, said electrical symmetry points being connected to ground;

means for directly electrically connecting one of the windings of said first surface resonator to said means for supplying and receiving; and means for directly connecting one of said windings of said second surface resonator to said means for supplying and receiving, said first and second capacitor means in combination having a capacitance different from the capacitance of said third and fourth capacitor means so that said first surface resonator has a resonant frequency different from the resonant frequency of said second surface resonator.

8. A surface resonator arrangement as claimed in claim 7, wherein each of the windings of said first and second surface resonators consists of a ribbon of electrically conductive foil.

9. A surface resonator arrangement as claimed in claim 8, wherein said foil consists of copper.

* * * * *